United States Patent
Jacobsen et al.

(10) Patent No.: US 9,929,714 B2
(45) Date of Patent: Mar. 27, 2018

(54) TEMPERATURE COMPENSATED BULK ACOUSTIC WAVE RESONATOR WITH A HIGH COUPLING COEFFICIENT

(71) Applicant: Texas Instruments Incorporated, Dallas, TX (US)

(72) Inventors: Stuart M. Jacobsen, Frisco, TX (US); Rick L. Wise, Fairview, TX (US); Maria Wang, Plano, TX (US); Ricky Alan Jackson, Richardson, TX (US); Nicholas S. Dellas, Dallas, TX (US); Django Earl Trombley, Dallas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 439 days.

(21) Appl. No.: 14/251,637

(22) Filed: Apr. 13, 2014

(65) Prior Publication Data

US 2015/0295556 A1  Oct. 15, 2015

(51) Int. Cl.
  *H03H 9/05* (2006.01)
  *H03H 9/02* (2006.01)
  *H03H 9/17* (2006.01)

(52) U.S. Cl.
  CPC ........ *H03H 9/02102* (2013.01); *H03H 9/175* (2013.01)

(58) Field of Classification Search
  CPC ............................ H03H 9/175; H03H 9/02102
  USPC .......................................... 310/321, 322, 346
  See application file for complete search history.

(56) References Cited

U.S. PATENT DOCUMENTS

| | | | |
|---|---|---|---|
| 6,087,198 A | 7/2000 | Panasik | |
| 6,548,942 B1 | 4/2003 | Panasik | |
| 6,841,922 B2 | 1/2005 | Aigner et al. | |
| 7,463,118 B2 | 12/2008 | Jacobsen | |
| 7,868,522 B2 * | 1/2011 | Ruby | H03H 3/04 310/312 |
| 2003/0184492 A1 * | 10/2003 | Chiang | H01Q 1/22 343/833 |
| 2005/0093656 A1 * | 5/2005 | Larson, III | H03H 9/132 333/191 |
| 2005/0231072 A1 | 10/2005 | Inoue et al. | |
| 2006/0214747 A1 * | 9/2006 | Lakin | H03H 9/175 333/189 |
| 2007/0040473 A1 * | 2/2007 | Ballandras | H03H 3/04 310/320 |
| 2007/0285191 A1 * | 12/2007 | Jacobsen | H03H 3/04 333/187 |
| 2010/0187948 A1 * | 7/2010 | Sinha | H03H 9/02086 310/313 C |

(Continued)

FOREIGN PATENT DOCUMENTS

JP  2009510884 A  6/2009

*Primary Examiner* — Bryan Gordon
(74) *Attorney, Agent, or Firm* — Jacqueline J. Garner; Charles A. Brill; Frank D. Cimino

(57) ABSTRACT

The dominant frequency of a solidly mounted resonator (100/280/300/400) is substantially increased by reducing the thickness of each layer of each Bragg acoustic reflector (112/160/224/274) to have a thickness than is substantially equal to one-quarter of the wavelength of a frequency that is a higher harmonic resonant frequency of the fundamental resonant frequency of the solidly mounted resonator (100/280/300/400).

20 Claims, 4 Drawing Sheets

(56) References Cited

U.S. PATENT DOCUMENTS

| | | | |
|---|---|---|---|
| 2011/0080233 A1* | 4/2011 | Petit | H03H 9/02102 333/187 |
| 2013/0300259 A1 | 11/2013 | Sinha et al. | |
| 2013/0320808 A1* | 12/2013 | Burgess | H03H 9/02102 310/340 |

* cited by examiner

TEMPERATURE COMPENSATED BULK ACOUSTIC WAVE RESONATOR WITH A HIGH COUPLING COEFFICIENT

BACKGROUND OF THE INVENTION

1. Field of the Invention

The present invention relates to bulk acoustic wave resonators and, more particularly, to a temperature compensated bulk acoustic wave resonator with a high coupling coefficient.

2. Description of the Related Art

A bulk acoustic wave (BAW) resonator is an electromechanical device that sandwiches a piezoelectric structure between a lower metallic electrode and an upper metallic electrode. When an alternating electric field is placed across the piezoelectric structure by way of the electrodes, the piezoelectric structure mechanically deforms in a periodic manner and generates a standing acoustic wave.

One type of BAW resonator is a solidly mounted resonator (SMR). A SMR uses a Bragg acoustic reflector to reflect the acoustic wave. A Bragg acoustic reflector is constructed with alternating layers of low-acoustic and high-acoustic material, where each layer of material has a thickness that corresponds to one-quarter of the wavelength of the fundamental resonant frequency of the SMR.

One type of SMR uses dual Bragg acoustic reflectors to reflect the acoustic wave. An SMR with dual Bragg acoustic reflectors has a lower Bragg acoustic reflector that touches and lies below the lower metallic electrode, and an upper Bragg acoustic reflector that touches and lies above the upper metallic electrode.

In semiconductor applications, the piezoelectric structure is typically implemented with aluminum nitride (AlN), although zinc oxide (ZnO) or lead zirconium titanate (PZT) are also commonly used. The piezoelectric structure has a thickness that is substantially equal to one-half of the wavelength of the fundamental resonant frequency of the SMR.

For example, a SMR with dual Bragg acoustic reflectors that has a 2.5 GHz fundamental resonant frequency has a piezoelectric structure with a thickness equal to one-half of the wavelength of the 2.5 GHz fundamental resonant frequency. In addition, each layer in each Bragg acoustic reflector has a thickness equal to one-quarter of the wavelength of the 2.5 GHz fundamental resonant frequency.

One of the problems with constructing a higher frequency SMR is that as the fundamental resonant frequency of the SMR increases, the thickness of the piezoelectric structure decreases. The problem with decreasing the thickness of an AlN piezoelectric structure is that AlN does not begin to grow into a well-textured, highly-oriented crystal structure until the first 100 nm or so of material has been deposited.

As a result, an AlN piezoelectric structure which has a thickness in the range of 100 nm-200 nm would be expected to have a low $K^2$ (electrical-acoustical coupling coefficient) as well as a low quality (Q) factor (a relatively wide range of frequencies centered on the fundamental resonant frequency), which degrades the needed performance of the device as a frequency reference.

Another problem with a SMR is that the SMR tends to have a relatively poor temperature coefficient of frequency (TCF), i.e., the fundamental resonant frequency changes a significant amount over temperature. One approach to reducing the TCF of a SMR to near zero ppm/° C. is to form a thin layer of oxide (e.g., 70 nm) that lies between the piezoelectric structure and the upper electrode. However, one problem with this approach is that the thin layer of oxide that lies between the piezoelectric structure and the upper electrode causes the $K^2$ to fall from approximately 6.9% to approximately 4%.

Thus, there is a need for a higher frequency SMR that has a $K^2$ above 6.5%, a high Q factor, and a TCF near zero ppm/° C.

SUMMARY OF THE INVENTION

The present invention provides a solidly mounted resonator (SMR) and a method of forming the SMR. A SMR of the present invention includes a substrate, and a lower Bragg acoustic reflector that touches the substrate. The lower Bragg acoustic reflector has alternating layers of a low-acoustic material and a high-acoustic material. Each layer of material within the lower Bragg acoustic reflector has a thickness substantially equal to one-quarter of a wavelength of a frequency that is a higher harmonic resonant frequency of a fundamental resonant frequency of the SMR. The SMR also includes a lower electrode that touches the lower Bragg acoustic reflector, a piezoelectric structure that touches the lower electrode, and an upper electrode that touches the piezoelectric structure.

A method of forming a SMR includes forming a lower Bragg acoustic reflector to touch a substrate. The lower Bragg acoustic reflector has alternating layers of a low-acoustic material and a high-acoustic material. Each layer of material within the lower Bragg acoustic reflector has a thickness substantially equal to one-quarter of a wavelength of a frequency that is a higher harmonic resonant frequency of a fundamental resonant frequency of the SMR. The method also includes forming a lower electrode that touches the lower Bragg acoustic reflector, forming a piezoelectric structure that touches the lower electrode, and forming an upper electrode that touches the piezoelectric structure.

A SMR of the present invention alternately includes a substrate, and a lower Bragg acoustic reflector that touches the substrate. The lower Bragg acoustic reflector has alternating layers of a low-acoustic material and a high-acoustic material. Each layer of material within the lower Bragg acoustic reflector has a thickness substantially equal to one-quarter of a wavelength of a fundamental resonant frequency of the SMR. The SMR also includes a lower isolation layer that touches the lower Bragg acoustic reflector, and a lower electrode that touches the lower isolation layer. The SMR further includes a piezoelectric structure that touches the lower electrode, and an upper electrode that touches the piezoelectric structure. The SMR additionally includes an upper isolation layer that touches the upper electrode, and an upper Bragg acoustic reflector that touches the upper isolation layer. The upper Bragg acoustic reflector has alternating layers of a low-acoustic material and a high-acoustic material. Each layer of material within the upper Bragg acoustic reflector has a thickness substantially equal to one-quarter of the wavelength of the fundamental resonant frequency of the SMR.

A better understanding of the features and advantages of the present invention will be obtained by reference to the following detailed description and accompanying drawings which set forth an illustrative embodiment in which the principals of the invention are utilized.

DETAILED DESCRIPTION OF THE INVENTION

Figure 1:
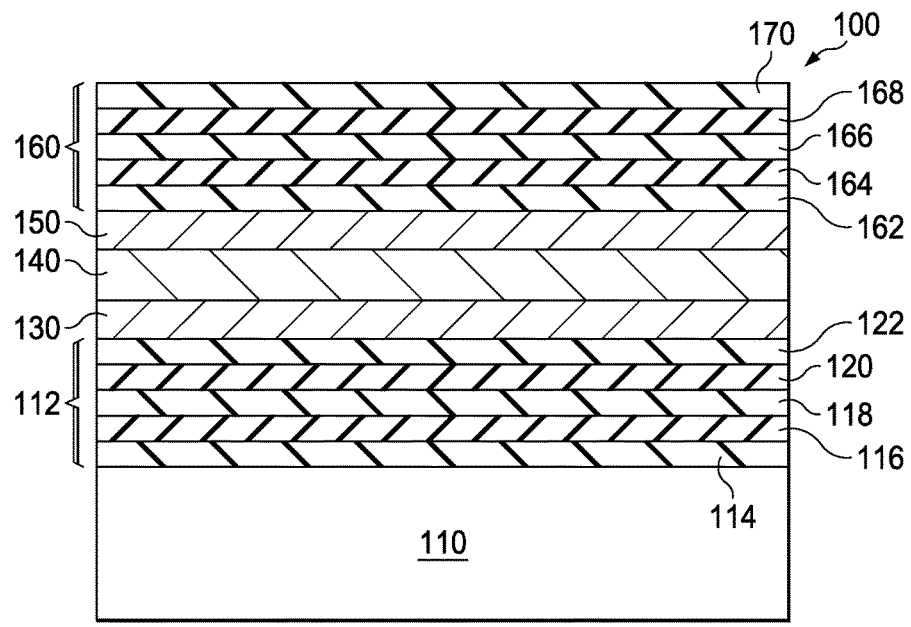
FIG. 1 is a cross-sectional view illustrating an example of a solidly mounted resonator (SMR) 100 in accordance with the present invention.

FIG. 1 shows a cross-sectional view that illustrates an example of a solidly mounted resonator (SMR) 100 in accordance with the present invention. As described in greater detail below, SMR 100 reduces the thickness of each layer within each Bragg acoustic reflector to be substantially equal to one-quarter of the wavelength of a frequency that is a higher harmonic resonant frequency of the fundamental resonant frequency of SMR 100.

As shown in FIG. 1, SMR 100 includes a substrate 110, and a lower Bragg acoustic reflector 112 that touches the top surface of substrate 110. Substrate 110 can be implemented with a number of materials such as, but not limited to, silicon, silicon germanium, sapphire, glass, or quartz.

Lower Bragg acoustic reflector 112, in turn, includes a number of layers of material that alternate between a low-acoustic material and a high-acoustic material. Each layer of material within lower Bragg acoustic reflector 112 has a thickness that is substantially equal to one-quarter of the wavelength of a frequency that is a higher harmonic resonant frequency of the fundamental resonant frequency of SMR 100.

The low-acoustic material can be implemented with a number of materials such as, but not limited to, methylsilsesquioxane (MSQ), silicon dioxide ($SiO_2$), or hydrogensilsesquiozane (HSQ). The high-acoustic material can be implemented with a number of materials such as, but not limited to, silicon carbon (SiC), silicon containing diamond-like-carbon (Si-DLC), or diamond-like-carbon (DLC).

In the present example, lower Bragg acoustic reflector 112 includes a low-acoustic layer 114 of $SiO_2$ that touches substrate 110, a high-acoustic layer 116 of SiC that touches low-acoustic layer 114, a low acoustic layer 118 of MSQ that touches high-acoustic layer 116, a high-acoustic layer 120 of SiC that touches low-acoustic layer 118, and a low-acoustic layer 122 of MSQ that touches high-acoustic layer 120.

As further shown in FIG. 1, SMR 100 also includes a lower electrode 130 that touches Bragg acoustic reflector 112, and a piezoelectric structure 140 that touches lower electrode 130. Lower electrode 130 can be implemented with a number of materials such as, but not limited to, molybdenum (Mo), titanium (Ti), tungsten (W), gold (Au), platinum (Pt), or aluminum (Al). In the present example, lower electrode 130 is implemented with Mo.

Piezoelectric structure 140, in turn, can be implemented with a number of materials such as, but not limited to, aluminum nitride (AlN), zinc oxide (ZnO) and lead zirconium titanate (PZT). In the present example, piezoelectric structure 140 is implemented with AlN. Piezoelectric structure 140 has a thickness that is substantially equal to one-half of the wavelength of the fundamental resonant frequency of SMR 100.

SMR 100 additionally includes an upper electrode 150 that touches piezoelectric structure 140, and an upper Bragg acoustic reflector 160 that touches upper electrode 150. Upper electrode 150 can be implemented with a number of materials such as, but not limited to, Mo, Ti, W, Au, Pt, or Al. In the present example, upper electrode 150 is implemented with Mo.

Upper Bragg acoustic reflector 160, in turn, includes a number of layers of material that alternate between a low-acoustic material and a high-acoustic material. Each layer of material within upper Bragg acoustic reflector 160 has a thickness that is substantially equal to the thickness of each layer of material within lower Bragg acoustic reflector 112, i.e., one-quarter of the wavelength of a frequency that is a higher harmonic resonant frequency of the fundamental resonant frequency of SMR 100.

As with lower Bragg acoustic reflector 112, the low-acoustic material of upper Bragg acoustic reflector 160 can be implemented with a number of materials such as, but not limited to, $SiO_2$ or MSQ. The high-acoustic material of upper Bragg acoustic reflector 160 can also be implemented with a number of materials such as, but not limited to, SiC, Si-DLC, or DLC.

In the present example, upper Bragg acoustic reflector 160 includes a low-acoustic layer 162 of MSQ that touches upper electrode 150, a high-acoustic layer 164 of SiC that touches low-acoustic layer 162, a low acoustic layer 166 of MSQ that touches high-acoustic layer 164, a high-acoustic layer 168 of SiC that touches low-acoustic layer 166, and a low-acoustic layer 170 of $SiO_2$ that touches high-acoustic layer 168.

In operation, the lower and upper electrodes 130 and 150 are connected to an alternating voltage source which, in turn, places an alternating electric field across piezoelectric structure 140. When an alternating electric field is placed across piezoelectric structure 140, piezoelectric structure 140 mechanically deforms in a periodic manner and generates a standing acoustic wave at the fundamental resonant frequency of piezoelectric structure 140.

However, unlike a prior art SMR which has lower and upper Bragg acoustic reflectors with layer thicknesses equal to one-quarter of the wavelength of the fundamental resonant frequency, SMR 100 has lower and upper Bragg acoustic reflectors with layer thicknesses substantially equal to one-quarter of the wavelength of a frequency that is a higher harmonic resonant frequency of the fundamental resonant frequency.

For example, a SMR which has a fundamental resonant frequency at 2.38 GHz and a piezoelectric structure that has a thickness substantially equal to one-half of the wavelength of the 2.38 GHz fundamental resonant frequency also has a strong higher harmonic resonant frequency at 8.55 GHz. By utilizing lower and upper Bragg acoustic reflectors where each layer within the lower and upper Bragg acoustic reflectors has a thickness substantially equal to one-quarter of the wavelength of the 8.55 GHz higher harmonic resonant frequency, the 8.55 GHz higher harmonic resonant frequency becomes the dominant frequency.

Thus, one of the advantages of SMR 100 is that a high-frequency resonator in the range of 5 GHz to 50 GHz can be constructed without resorting to ultra-thin piezoelectric structures, thereby continuing to utilize the thicker well-textured, highly-oriented piezoelectric structures, higher $K^2$ (electrical-acoustical coupling coefficient), and higher Q factor that are associated with a lower fundamental resonant frequency (e.g., 2.5 GHz) SMR.

Although the present invention has been described with respect to a SMR with dual Bragg acoustic reflectors, the present invention also applies to a SMR with a single Bragg acoustic reflector. A SMR with a single Bragg acoustic reflector is the same as SMR 100 except that upper Bragg acoustic reflector 160 is omitted.

Figure 2A:
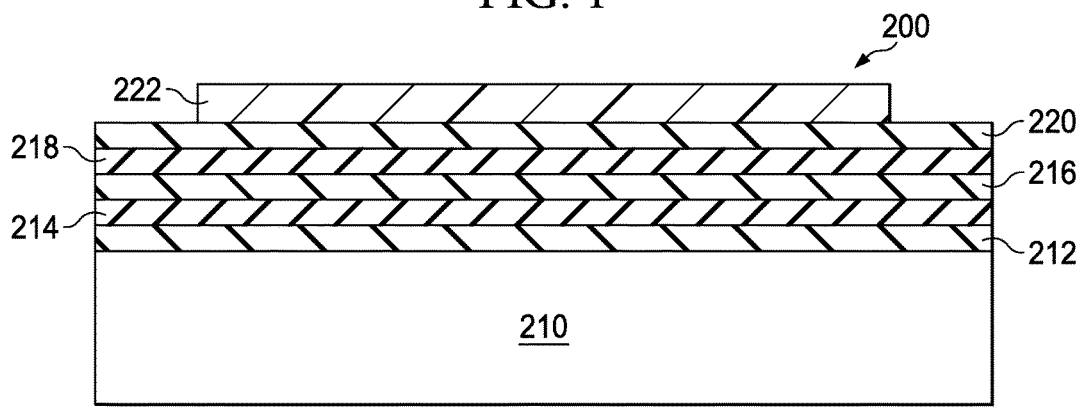
FIGS. 2A-2F are cross-sectional views illustrating an example of a method 200 of forming a SMR in accordance with the present invention.

FIGS. 2A-2F show cross-sectional views that illustrate an example of a method 200 of forming a SMR in accordance with the present invention. As shown in FIG. 2A, method 200 utilizes a conventionally-formed substrate 210. Substrate 210 can be implemented with a number of different materials, with the choice being largely dependent on a material that is compatible with the existing processes at a fabrication facility. In the present example, substrate 202 is implemented with silicon.

As further shown in FIG. 2A, method 200 begins by forming a lower Bragg acoustic reflector on the top surface of substrate 210. The lower Bragg acoustic reflector is constructed with alternating layers of a low-acoustic material, such as methylsilsesquioxane (MSQ), silicon dioxide ($SiO_2$), or hydrogensilsesquiozane (HSQ), and a high-acoustic material, such as silicon carbon (SiC), silicon containing diamond-like-carbon (Si-DLC), or diamond-like-carbon (DLC).

The layers of low-acoustic material and high-acoustic material are each formed to have a thickness that is substantially equal to one-quarter of the wavelength of a frequency that is a higher harmonic resonant frequency of the fundamental resonant frequency. Thus, the layers of low-acoustic material and high-acoustic material in method 200 are thinner than in a prior art SMR where the thickness of each layer of low-acoustic material and each layer of high-acoustic material is equal to one-quarter of the wavelength of the fundamental resonant frequency.

In the present example, as shown in FIG. 2A, the lower Bragg acoustic reflector is constructed by forming a $SiO_2$ layer 212 in a conventional manner on the top surface of substrate 210. Following this, a SiC layer 214 is conventionally formed on the top surface of $SiO_2$ layer 212. For example, SiC can be formed in a plasma chemical vapor deposition (CVD) chamber using a mixture of silane ($SiH_4$) and methane ($CH_4$).

After SiC layer 214 has been formed, a MSQ layer 216 is formed in a conventional fashion on the top surface of SiC layer 214. For example, MSQ can be spun on to the desired thickness, and then cured. Next, a SiC layer 218 is conventionally formed on MSQ layer 216, followed by the conventional formation of a MSQ layer 220 on SiC layer 218.

Once MSQ layer 220 has been formed, a patterned photoresist layer 222 is formed on the top surface of MSQ layer 220. Patterned photoresist layer 222 is formed in a conventional manner, which includes depositing a layer of photoresist, projecting a light through a patterned black/clear glass plate known as a mask to form a patterned image on the layer of photoresist, and removing the imaged photoresist regions which were softened by exposure to the light.

Figure 2B:
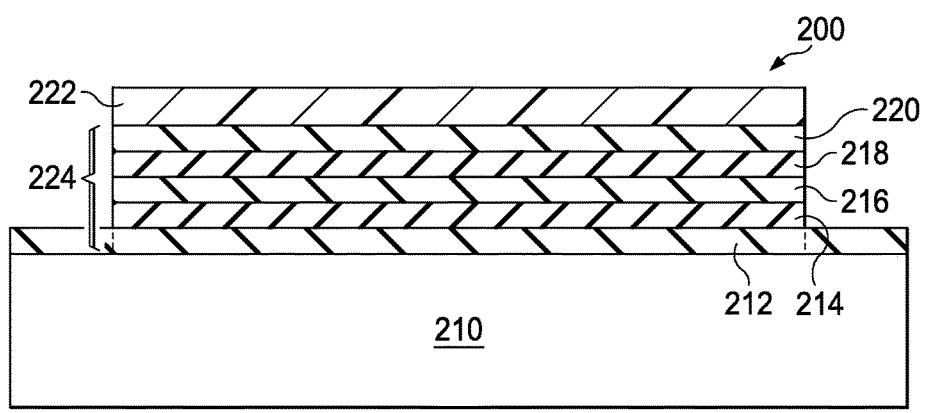

As shown in FIG. 2B, after patterned photoresist layer 222 has been formed, the exposed regions of MSQ layer 220 and the underlying regions of SiC layer 218, MSQ layer 216, and SiC layer 214 are etched to expose the top surface of $SiO_2$ layer 212. (The exposed region of $SiO_2$ layer 212 can alternately be removed.)

Following this, patterned photoresist layer 222 is removed in a conventional manner, such as with an ash process, to complete the formation of a lower Bragg acoustic reflector 224. Thus, in the present example, lower Bragg acoustic reflector 224 includes the remaining portions of MSQ layer 220, SiC layer 218, MSQ layer 216, and SiC layer 214, and the underlying portion of $SiO_2$ layer 212.

Figure 2C:
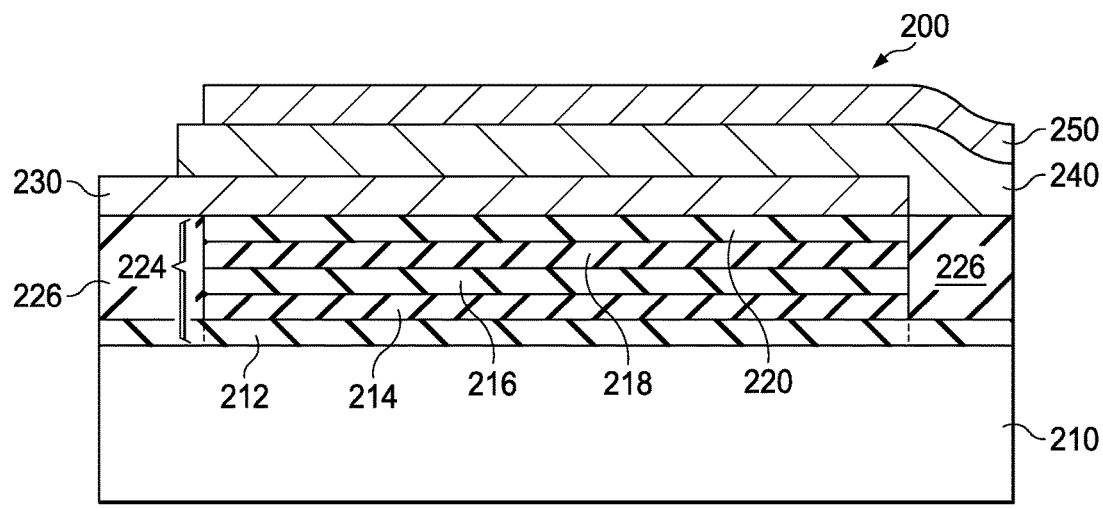

Next, as shown in FIG. 2C, an isolation structure 226 is formed on the top surface of $SiO_2$ layer 212 (or alternately on the top surface of substrate 210 if the exposed portion of $SiO_2$ layer 212 was removed) to have a top surface that is substantially planar with the top surface of Bragg acoustic reflector 224. For example, a $SiO_2$ layer can be deposited and then planarized in a conventional fashion, such as by chemical mechanical polishing.

Following this, a lower electrode 230 is formed on the top surface of Bragg acoustic reflector 224 and isolation structure 226. Lower electrode 230 can be constructed with a metallic layer such as molybdenum (Mo), titanium (Ti), tungsten (W), gold (Au), platinum (Pt), or aluminum (Al).

In the present example, lower electrode 230 is constructed by forming a Mo layer in a conventional manner on the top surface of Bragg acoustic reflector 224 and isolation structure 226. For example, the Mo layer can be sputter deposited. After the Mo layer has been deposited, a patterned photoresist layer is conventionally formed on the top surface of the Mo layer.

After the patterned photoresist layer has been formed, the exposed region of the Mo layer is etched to expose the top surface of isolation structure 226. Following this, the patterned photoresist layer is removed in a conventional manner to complete the formation of lower electrode 230.

Once lower electrode 230 has been formed, a piezoelectric structure 240 is next formed on the top surface of isolation structure 226 and lower electrode 230. Piezoelectric structure 240 can be constructed with, for example, aluminum nitride (AlN), zinc oxide (ZnO), or lead zirconium titanate (PZT).

In the present example, piezoelectric structure 240 is constructed by forming an AlN layer in a conventional manner on the top surface of isolation structure 226 and lower electrode 230. For example, the AlN layer can be sputter deposited in nitrogen gas to produce crystals that are highly oriented. After the AlN layer has been deposited, a patterned photoresist layer is conventionally formed on the top surface of the AlN layer.

After the patterned photoresist layer has been formed, the exposed region of the AlN layer is etched to expose the top surface of lower electrode 230. Following this, the patterned photoresist layer is removed in a conventional manner to complete the formation of piezoelectric structure 240.

Once piezoelectric structure 240 has been formed, an upper electrode 250 is formed on the top surface of piezoelectric structure 240. Upper electrode 250 can be constructed with a metallic layer such as Mo, Ti, W, Au, Pt, or Al. In the present example, upper electrode 250 is constructed by forming a Mo layer in a conventional fashion on the top surface of piezoelectric structure 240. For example, the Mo layer can be sputter deposited. After the Mo layer has been deposited, a patterned photoresist layer is conventionally formed on the top surface of the Mo layer.

After the patterned photoresist layer has been formed, the exposed region of the Mo layer is etched to expose the top surface of piezoelectric structure 240. Following this, the patterned photoresist layer is removed in a conventional manner to complete the formation of upper electrode 250.

Once upper electrode 250 has been formed, an upper Bragg acoustic reflector is on the top surface of upper electrode 250. The upper Bragg acoustic reflector is constructed with alternating layers of a low-acoustic material, such as $SiO_2$ or MSQ, and a high-acoustic material, such as SiC, Si-DLC, or DLC.

The layers of low-acoustic material and high-acoustic material are each formed to have a thickness that is equal to one-quarter of the wavelength of the frequency that is the higher harmonic resonant frequency of the fundamental resonant frequency, and have substantially the same thicknesses as the layers within lower Bragg acoustic reflector 224.

Figure 2D:
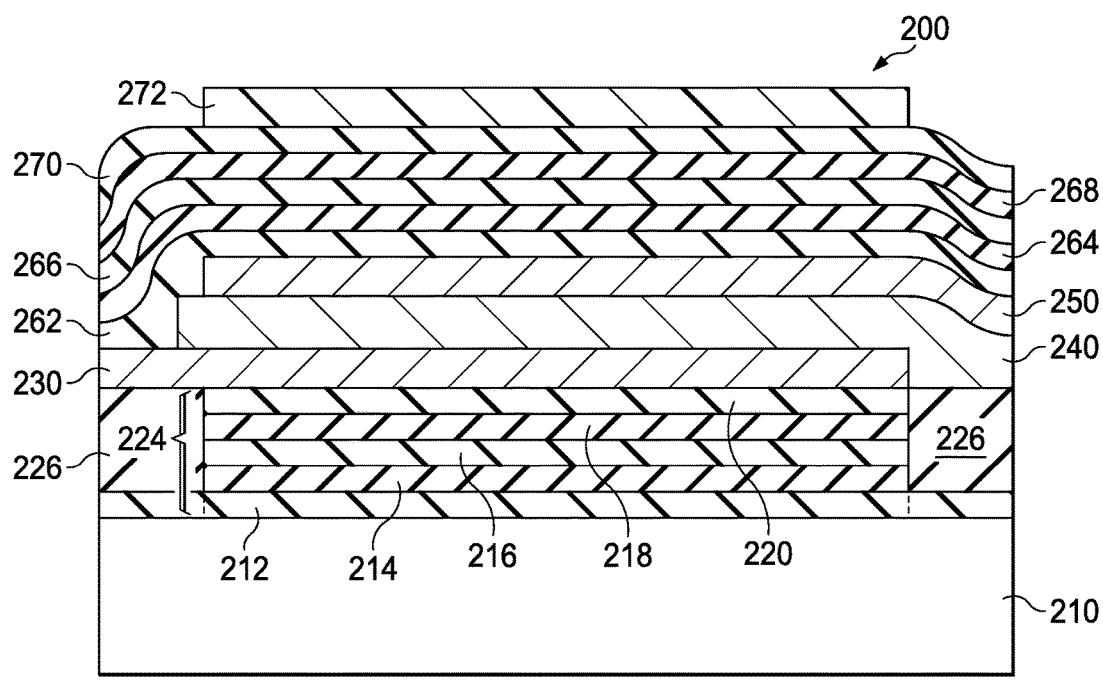

In the present example, as shown in FIG. 2D, the upper Bragg acoustic reflector is constructed by forming a MSQ layer 262 in a conventional manner on the top surface of upper electrode 250. For example, MSQ can be spun on to the desired thickness, and then cured. Following this, a SiC layer 264 is conventionally formed on the top surface of MSQ layer 262. For example, SiC can be formed in a plasma CVD chamber using a mixture of $SiH_4$ and $CH_4$.

After SiC layer 264 has been formed, a MSQ layer 266 is formed in a conventional fashion on the top surface of SiC layer 264. Next, a SiC layer 268 is conventionally formed on MSQ layer 266, followed by the conventional formation of a $SiO_2$ layer 270. Once $SiO_2$ layer 270 has been formed, a patterned photoresist layer 272 is formed on the top surface of $SiO_2$ layer 270 in a conventional manner.

Figure 2E:
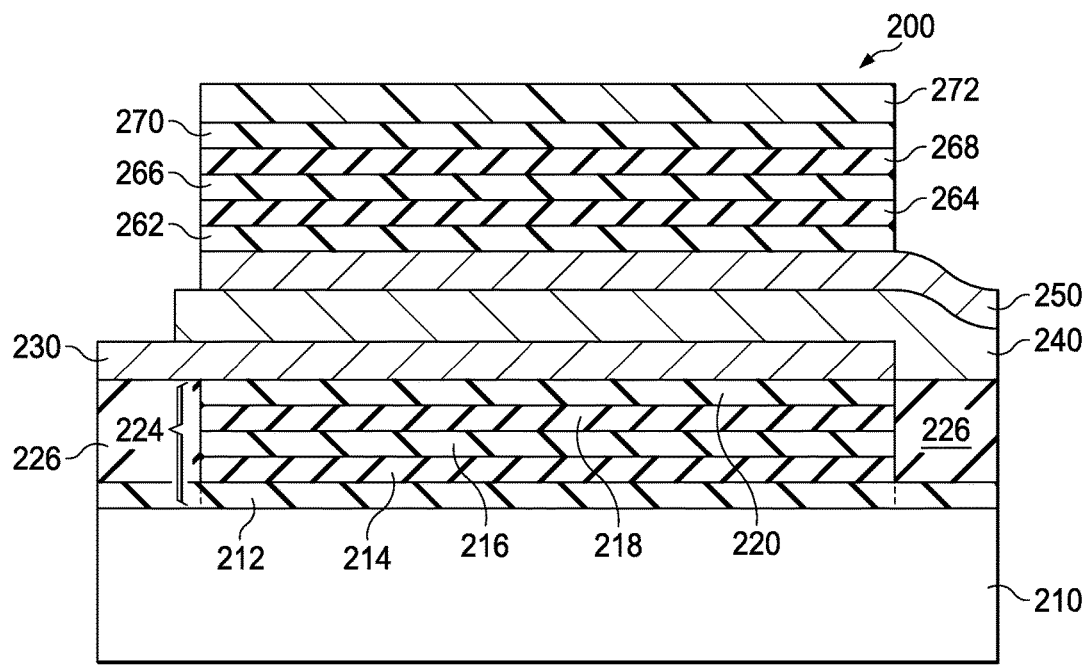
Figure 2F:
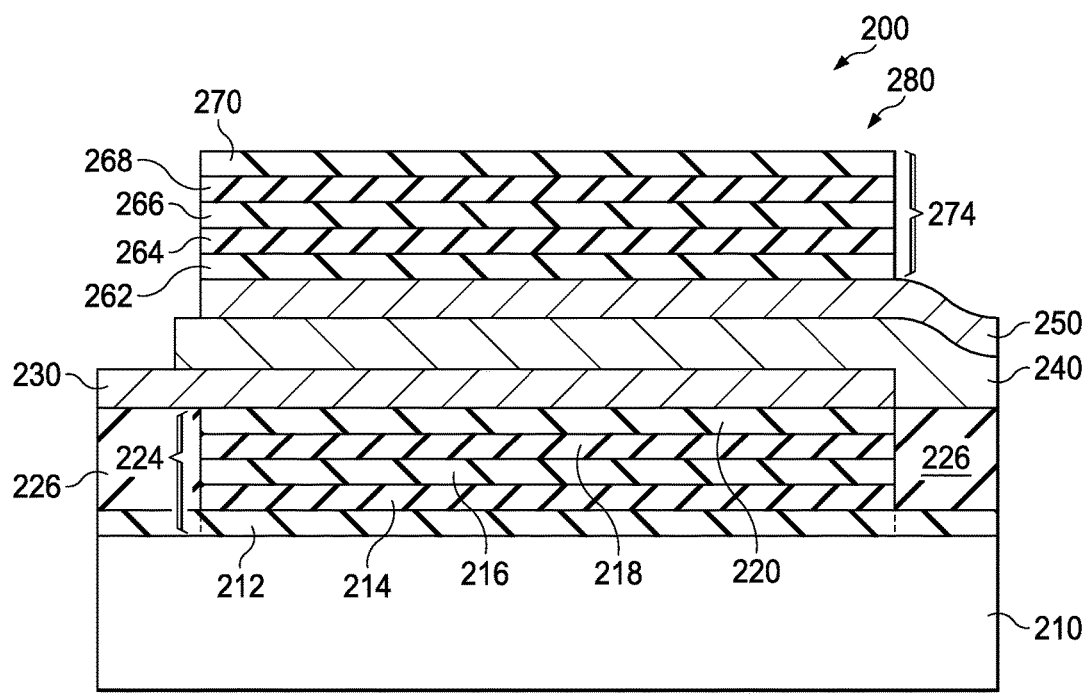

As shown in FIG. 2E, after patterned photoresist layer 272 has been formed, the exposed regions of $SiO_2$ layer 270 and the underlying regions of SiC layer 268, MSQ layer 266, SiC layer 264, and MSQ layer 262 are etched to expose the top surface of upper electrode 250. Following this, as shown in FIG. 2F, patterned photoresist layer 272 is removed in a conventional manner, such as with an ash process, to complete the formation of an upper Bragg acoustic reflector 274 and a SMR 280. Once upper Bragg acoustic reflector 274 and SMR 280 have been formed, method 200 continues with conventional steps.

Figure 3:
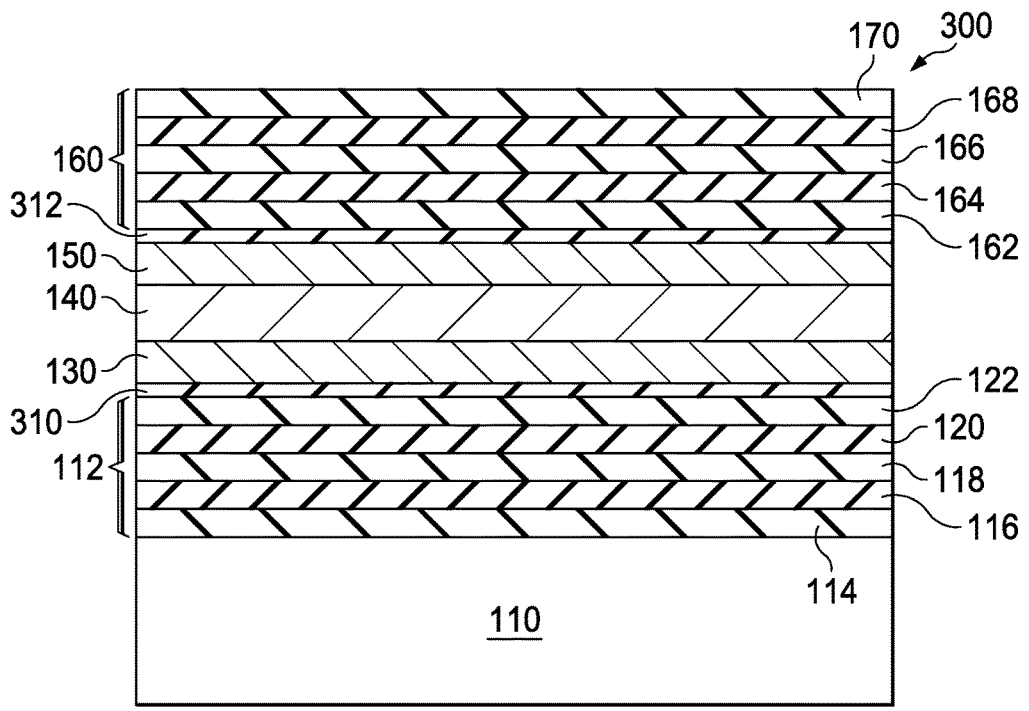
FIG. 3 is a cross-sectional view illustrating an example of a solidly mounted resonator (SMR) 300 in accordance with an alternate embodiment of the present invention.

FIG. 3 shows a cross-sectional view that illustrates an example of a solidly mounted resonator (SMR) 300 in accordance with an alternate embodiment of the present invention. SMR 300 is similar to SMR 100 and, as a result, utilizes the same reference numerals to designate the structures that are common to both SMRs.

As shown in FIG. 3, SMR 300 differs from SMR 100 in that SMR 300 also includes a lower isolation layer 310 that touches and lies between lower Bragg acoustic reflector 112 and lower electrode 130, and an upper isolation layer 312 that touches and lies between upper electrode 150 and upper Bragg acoustic reflector 160.

The thicknesses of the lower and upper isolation layers 310 and 312 are unrelated to the thicknesses of the layers within the lower and upper Bragg acoustic reflectors 112 and 160. In the present example, the lower and upper isolation layers 310 and 312 are implemented with $SiO_2$, and each have thicknesses in the range of 10-50 nm.

SMR 300 operates the same as SMR 100 except that SMR 300 has a temperature coefficient of frequency (TCF) near zero ppm/° C. with a total frequency range of approximately 160 ppm in the temperature range of −40° C. to 85° C. However, unlike a prior art SMR which utilizes a $SiO_2$ layer that lies between the piezoelectric structure and the upper electrode to reduce the TCF to near zero ppm/° C., SMR 300 has a $K^2$ greater than 6.5% (e.g., 6.8%).

SMR 300 is formed the same way as SMR 100 except that a lower isolation layer, such as a layer of oxide, is conventionally formed on lower Bragg acoustic reflector 212 before lower electrode 230 is formed, and an upper isolation layer, such as a layer of oxide, is conventionally formed on upper electrode 250 before upper Bragg acoustic reflector 274 is formed.

An SMR in accordance with an alternate embodiment of the present invention is the same as SMR 300 except each layer of lower Bragg acoustic reflector 112 and each layer of upper Bragg acoustic reflector 160 has a thickness that is substantially equal to one-quarter of the wavelength of the fundamental resonant frequency. In addition to the lower and upper isolation layers 310 and 312, an additional isolation layer can also be placed to touch and lie between piezoelectric structure 140 and upper electrode 150, for the case where each layer of the Bragg acoustic reflectors has a thickness substantially equal to one-quarter of the wavelength of the frequency that is the higher harmonic resonant frequency of the fundamental resonant frequency, or the case where each layer of the Bragg acoustic reflectors has a thickness substantially equal to one-quarter of the wavelength of the fundamental resonant frequency. The additional isolation layer provides a slight additional reduction in the TCF, but reduces the $K^2$. Although the additional isolation layer reduces the $K^2$, the $K^2$ remains above 6%.

Figure 4:
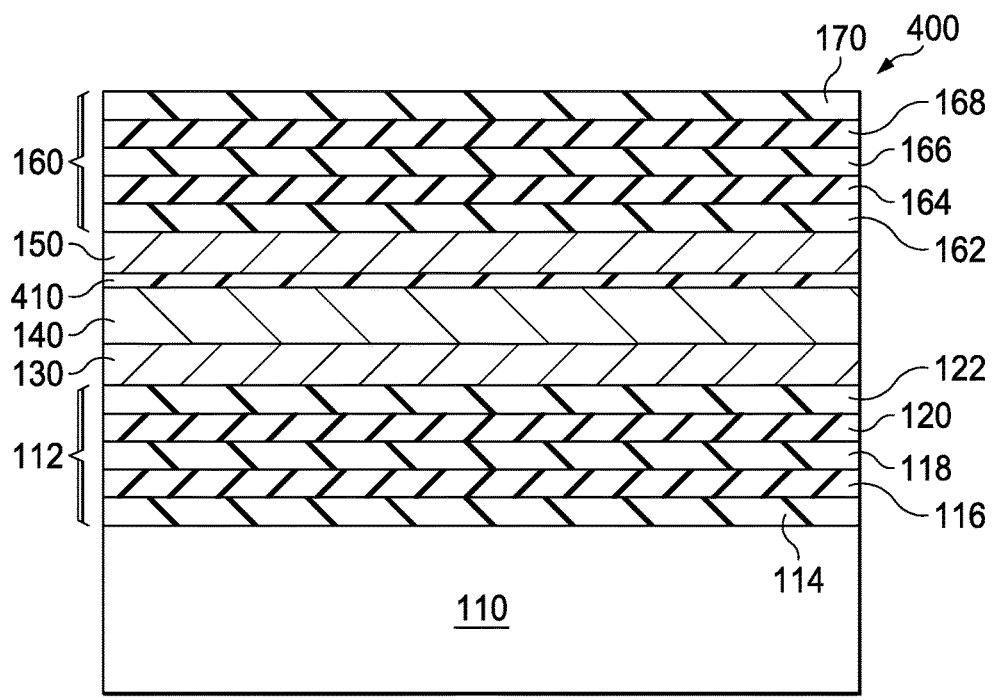
FIG. 4 is a cross-sectional view illustrating an example of a solidly mounted resonator (SMR) 400 in accordance with an alternate embodiment of the present invention.

FIG. 4 shows a cross-sectional view that illustrates an example of a solidly mounted resonator (SMR) 400 in accordance with an alternate embodiment of the present invention. SMR 400 is similar to SMR 100 and, as a result, utilizes the same reference numerals to designate the structures that are common to both SMRs.

As shown in FIG. 4, SMR 400 differs from SMR 100 in that SMR 400 also includes an isolation layer 410 that touches and lies between piezoelectric structure 140 and upper electrode 150. SMR 400 operates the same as SMR 100 except that SMR 400 has a temperature coefficient of frequency (TCF) near zero ppm/° C., but a $K^2$ of approximately 4%. SMR 400 is formed the same way as SMR 100 except that an isolation layer, such as a layer of oxide approximately 70 nm thick, is conventionally formed on piezoelectric structure 240 before upper electrode 250 is formed.

It should be understood that the above descriptions are examples of the present invention, and that various alternatives of the invention described herein may be employed in practicing the invention. Thus, it is intended that the following claims define the scope of the invention and that structures and methods within the scope of these claims and their equivalents be covered thereby.

What is claimed is:

1. A solidly mounted resonator (SMR) comprising:
    a substrate;
    a lower Bragg acoustic reflector that touches the substrate, the lower Bragg acoustic reflector having alternating layers of a low-acoustic material and a high-acoustic material, each layer of material within the lower Bragg acoustic reflector having a thickness substantially equal to one-quarter of a wavelength of a frequency that is a higher harmonic resonant frequency of a fundamental resonant frequency of the SMR;
    a lower electrode that touches the lower Bragg acoustic reflector;
    a piezoelectric structure that touches the lower electrode, wherein the piezoelectric structure has a thickness substantially equal to one-half of the wavelength of the fundamental resonant frequency of the SMR; and
    an upper electrode that touches the piezoelectric structure.

2. The SMR of claim 1 and further comprising an upper Bragg acoustic reflector that touches the upper electrode, the upper Bragg acoustic reflector having alternating layers of a low-acoustic material and a high-acoustic material, each layer of material within the upper Bragg acoustic reflector having a thickness substantially equal to one-quarter of the wavelength of the frequency that is the higher harmonic resonant frequency of the fundamental resonant frequency of the SMR.

3. The SMR of claim 2 and further comprising:
a lower isolation layer that lies between and touches the lower Bragg acoustic reflector and the lower electrode; and
an upper isolation layer that lies between and touches the upper electrode and the upper Bragg acoustic reflector.

4. The SMR of claim 2 and further comprising an isolation layer that lies between and touches the piezoelectric structure and the upper electrode.

5. The SMR of claim 2, wherein the piezoelectric structure includes a material selected from a list of materials that includes AlN, ZnO, and PZT.

6. The SMR of claim 5 wherein the low-acoustic material is selected from a list of materials that includes MSQ, SiO$_2$, and HSQ.

7. The SMR of claim 6 wherein the high-acoustic material is selected from a list of materials that includes SiC, Si-DLC, and DLC.

8. A method of forming a solidly mounted resonator (SMR) comprising:
forming a lower Bragg acoustic reflector to touch a substrate, the lower Bragg acoustic reflector having alternating layers of a low-acoustic material and a high-acoustic material, each layer of material within the lower Bragg acoustic reflector having a thickness substantially equal to one-quarter of a wavelength of a frequency that is a higher harmonic resonant frequency of a fundamental resonant frequency of the SMR;
forming a lower electrode that touches the lower Bragg acoustic reflector;
forming a piezoelectric structure that touches the lower electrode; wherein the piezoelectric structure has a thickness substantially equal to one-half of the wavelength of the fundamental resonant frequency of the SMR; and
forming an upper electrode that touches the piezoelectric structure.

9. The method of claim 8 and further comprising forming an upper Bragg acoustic reflector that touches the upper electrode, the upper Bragg acoustic reflector having alternating layers of a low-acoustic material and a high-acoustic material, each layer of material within the upper Bragg acoustic reflector having a thickness substantially equal to one-quarter of the wavelength of the frequency that is the higher harmonic resonant frequency of the fundamental resonant frequency of the SMR.

10. The method of claim 9 and further comprising:
forming a lower isolation layer that lies between and touches the lower Bragg acoustic reflector and the lower electrode; and
forming an upper isolation layer that lies between and touches the upper electrode and the upper Bragg acoustic reflector.

11. The method of claim 9 and further comprising forming an isolation layer that lies between and touches the piezoelectric structure and the upper electrode.

12. The method of claim 8, wherein the piezoelectric structure includes a material selected from a list of materials that includes AlN, ZnO, and PZT.

13. The method of claim 12 wherein the low-acoustic material is selected from a list of materials that includes MSQ, SiO$_2$, and HSQ.

14. The method of claim 13 wherein the high-acoustic material is selected from a list of materials that includes SiC, Si-DLC, and DLC.

15. A solidly mounted resonator (SMR) comprising:
a substrate;
a lower Bragg acoustic reflector that touches the substrate, the lower Bragg acoustic reflector having alternating layers of a low-acoustic material and a high-acoustic material, each layer of material within the lower Bragg acoustic reflector having a thickness substantially equal to one-quarter of a wavelength of a frequency that is a higher harmonic resonant frequency of a fundamental resonant frequency of the SMR;
a lower isolation layer that touches the lower Bragg acoustic reflector;
a lower electrode that touches the lower isolation layer;
a piezoelectric structure that touches the lower electrode, wherein the piezoelectric structure has a thickness substantially equal to one-half of the wavelength of the fundamental resonant frequency of the SMR;
an upper electrode that touches the piezoelectric structure;
an upper isolation layer that touches the upper electrode; and
an upper Bragg acoustic reflector that touches the upper isolation layer, the upper Bragg acoustic reflector having alternating layers of a low-acoustic material and a high-acoustic material, each layer of material within the upper Bragg acoustic reflector having a thickness substantially equal to one-quarter of the wavelength of the frequency that is a higher harmonic resonant frequency of the fundamental resonant frequency of the SMR.

16. The SMR of claim 15, wherein the piezoelectric structure includes a material selected from a list of materials that includes AlN, ZnO, and PZT.

17. The SMR of claim 16 wherein:
the low-acoustic material is selected from a list of materials that includes MSQ, SiO$_2$, and HSQ; and
the high-acoustic material is selected from a list of materials that includes SiC, Si-DLC, and DLC.

18. The SMR of claim 1, wherein the higher harmonic resonant frequency is a non-integer multiple of the fundamental resonant frequency.

19. The SMR of claim 8, wherein the higher harmonic resonant frequency is a non-integer multiple of the fundamental resonant frequency.

20. The SMR of claim 15, wherein the higher harmonic resonant frequency is a non-integer multiple of the fundamental resonant frequency.

* * * * *